(12) United States Patent
Pejman et al.

(10) Patent No.: US 9,305,768 B2
(45) Date of Patent: Apr. 5, 2016

(54) METHOD FOR PROCESSING FLAT ARTICLES

(71) Applicant: Akrion Systems, LLC, Allentown, PA (US)

(72) Inventors: Fani Pejman, San Diego, CA (US); Mark Rouillard, Mission Viejo, CA (US); John Korbler, Mertztown, PA (US); James Brown, Jim Thorpe, PA (US); Chad Hosack, Tigard, OR (US)

(73) Assignee: AKRION SYSTEMS LLC

(*) Notice: Subject to any disclaimer, the term of this patent is extended or adjusted under 35 U.S.C. 154(b) by 528 days.

(21) Appl. No.: 13/686,697

(22) Filed: Nov. 27, 2012

(65) Prior Publication Data

US 2013/0333723 A1    Dec. 19, 2013

Related U.S. Application Data

(60) Division of application No. 12/871,286, filed on Aug. 30, 2010, now Pat. No. 8,316,869, which is a continuation of application No. 11/625,556, filed on Jan. 22, 2007, now Pat. No. 7,784,478.

(60) Provisional application No. 60/760,820, filed on Jan. 20, 2006, provisional application No. 60/837,965, filed on Aug. 16, 2006, provisional application No. 60/850,930, filed on Oct. 11, 2006.

(51) Int. Cl.
| | |
|---|---|
| *B08B 3/12* | (2006.01) |
| *B08B 3/10* | (2006.01) |
| *B08B 3/04* | (2006.01) |
| *H01L 21/02* | (2006.01) |
| *H01L 21/67* | (2006.01) |

(52) U.S. Cl.
CPC ............ *H01L 21/02057* (2013.01); *B08B 3/04* (2013.01); *B08B 3/10* (2013.01); *B08B 3/12* (2013.01); *H01L 21/67051* (2013.01)

(58) Field of Classification Search
CPC .............. B08B 3/12; B08B 3/10; B08B 3/04; B08B 1/04
USPC .......................................... 134/1, 1.3, 32, 33
See application file for complete search history.

(56) References Cited

U.S. PATENT DOCUMENTS

| | | | |
|---|---|---|---|
| 4,401,131 A | 8/1983 | Lawson | |
| 5,037,481 A * | 8/1991 | Bran | ................................ 134/1 |
| (Continued) | | | |

FOREIGN PATENT DOCUMENTS

WO    WO 81/00078    1/1981

*Primary Examiner* — Saeed T Chaudhry
(74) *Attorney, Agent, or Firm* — The Belles Group, P.C.

(57) ABSTRACT

A method for processing flat articles with acoustical energy. The inventive system method can remove particles from both sides of a wafer more efficiently and effectively. In one aspect, the invention is a method for processing flat articles wherein a liquid is applied to both major surfaces of the flat article. A first transducer assembly is positioned adjacent to a first of the major surfaces of the flat article and a second member is positioned adjacent to a second of the major surfaces. The first transducer assembly generates and transmits acoustical energy to the first major surface of the flat article while the second member either: (1) reflects the acoustical energy generated by the first transducer assembly back to the second major surface of the flat article; and/or (2) generates and transmits acoustical energy to the second major surface of the flat article.

11 Claims, 14 Drawing Sheets

(56) References Cited

U.S. PATENT DOCUMENTS

| | | | |
|---|---|---|---|
| 5,090,432 A | 2/1992 | Bran | |
| 5,286,657 A | 2/1994 | Bran | |
| 5,556,479 A | 9/1996 | Bran | |
| 6,039,059 A * | 3/2000 | Bran | 134/105 |
| 6,122,837 A | 9/2000 | Olesen | |
| 6,140,744 A | 10/2000 | Bran | |
| 6,295,999 B1 | 10/2001 | Bran | |
| 6,378,534 B1 | 4/2002 | Olesen | |
| 6,463,938 B2 | 10/2002 | Bran | |
| 6,539,952 B2 | 4/2003 | Itzkowitz | |
| 6,539,962 B2 | 4/2003 | Paper | |
| 6,543,080 B1 * | 4/2003 | Tomita et al. | 15/102 |
| 6,679,272 B2 | 1/2004 | Bran | |
| 6,681,782 B2 | 1/2004 | Bran | |
| 6,684,891 B2 | 2/2004 | Bran | |
| 6,699,111 B2 | 3/2004 | Legner et al. | |
| 6,732,749 B2 | 5/2004 | Myland | |
| 6,754,980 B2 | 6/2004 | Lauerhaas | |
| 6,799,583 B2 | 10/2004 | Puri | |
| 6,843,855 B2 | 1/2005 | Verhaverbeke | |
| 6,866,051 B1 | 3/2005 | Nickhou et al. | |
| 6,904,921 B2 | 6/2005 | Beck | |
| 6,946,774 B2 | 9/2005 | Beck | |
| 6,951,042 B1 | 10/2005 | Mikhaylichenko et al. | |
| 6,955,727 B2 | 10/2005 | Korbler | |
| 7,100,304 B2 | 9/2006 | Lauerhaas | |
| 7,145,286 B2 | 12/2006 | Beck | |
| 2002/0029788 A1 | 3/2002 | Verhaverbeke et al. | |
| 2002/0185152 A1 | 12/2002 | Lauerhaas et al. | |
| 2003/0192571 A1 | 10/2003 | Yeo et al. | |
| 2004/0069319 A1 * | 4/2004 | Boyd et al. | 134/1.3 |
| 2004/0113524 A1 | 6/2004 | Baumgartner et al. | |
| 2004/0132318 A1 | 7/2004 | Kim et al. | |
| 2004/0168706 A1 | 9/2004 | Boyd et al. | |
| 2005/0003737 A1 | 1/2005 | Montierth et al. | |
| 2005/0145267 A1 | 7/2005 | Korolik et al. | |
| 2005/0199277 A1 | 9/2005 | Scranton | |
| 2005/0221038 A1 | 10/2005 | Park | |
| 2005/0252522 A1 | 11/2005 | Struven | |
| 2006/0278253 A1 | 12/2006 | Verhaverbeke | |

* cited by examiner

METHOD FOR PROCESSING FLAT ARTICLES

CROSS-REFERENCE TO RELATED PATENT APPLICATIONS

The present patent application is divisional of U.S. patent application Ser. No. 12/871,286, filed Aug. 30, 2010, now issued as U.S. Pat. No. 8,316,869, which in turn is a continuation of U.S. patent application Ser. No. 11/625,556, filed Jan. 22, 2007, now issued as U.S. Pat. No. 7,784,478, which in turn claims the benefit of U.S. Provisional Patent Application Ser. No. 60/760,820, filed Jan. 20, 2006; U.S. Provisional Patent Application Ser. No. 60/837,965, filed Aug. 16, 2006; and U.S. Provisional Patent Application Ser. No. 60/850,930, filed Oct. 11, 2006, the entireties of which are hereby incorporated by reference.

FIELD OF THE INVENTION

The present invention relates generally to the field of processing flat articles utilizing acoustic energy and specifically to systems, methods and apparatus that utilize acoustic energy for cleaning flat articles, such as semiconductor wafers.

BACKGROUND OF THE INVENTION

In the field of semiconductor manufacturing, it has been recognized since the beginning of the industry that removing particles from semiconductor wafers during the manufacturing process is a critical requirement to producing quality profitable wafers. While ninny different systems and methods have been developed over the years to remove particles from semiconductor waters, many of these systems and methods are undesirable because they damage the wafers. Thus, the removal of particles from wafers, which is often measured in terms of the particle removal efficiency ("PRE"), must be balanced against the amount of damage caused to the wafers by the cleaning method and/or system. It is therefore desirable for a cleaning method or system to be able to break particles free from the delicate semiconductor wafer without resulting in damage to the devices on the wafer surface.

Existing techniques for freeing the particles from the surface of a semiconductor wafer utilize a combination of chemical and mechanical processes. One typical cleaning chemistry used in the art is standard clean 1 ("SC1"), which is a mixture of ammonium hydroxide, hydrogen peroxide, and water. SC1 oxidizes and etches the surface of the wafer. This etching process known as undercutting, reduces the physical contact area of the wafer surface to which the particle is bound, thus facilitating ease of removal. However, a mechanical process is still required to actually remove the particle from the wafer surface.

For larger particles and for larger devices, scrubbers have historically been used to physically brush the particle of the surface of the wafer. However, as devices shrank in size, scrubbers and other forms of physical cleaning became inadequate because their physical contact with the wafers began to cause catastrophic damage to the smaller/miniaturized devices.

Recently, the application of sonic/acoustical energy to the wafers during chemical processing has replaced physical scrubbing to effectuate particle removal. The terms "acoustical" and "sonic" are used interchangeably throughout this application. The acoustical energy used in substrate processing is generated via a source of acoustical energy, which typically comprises a transducer which is made of piezoelectric crystal. In operation, the transducer is coupled to a power source (i.e. a source of electrical energy). An electrical energy signal (i.e. electricity) is supplied to the transducer. The transducer converts this electrical energy signal into vibrational mechanical energy (i.e. sonic/acoustical energy) which is then transmitted to the substrate(s) being processed. Characteristics of the electrical energy signal, which is typically in a sinusoidal waveform, supplied to the transducer from the power source dictate the characteristics of the acoustical energy generated by the transducer. For example, increasing, the frequency and/or power of the electrical energy signal will increase the frequency and/or power of the acoustical energy being generated by the transducer.

Over time, wafer cleaning utilizing acoustic energy became the most effective method of particle removal in semiconductor wet process applications. Acoustical energy has proven to be an effective way to remove particles, but as with any mechanical process, damage is possible and acoustical cleaning is faced with the same damage issues as traditional physical cleaning methods and apparatus. In the past, cleaning systems utilizing acoustical energy were designed to process semiconductor wafers in batches, typically cleaning twenty-five substrates at once. The benefits of batch cleaning became less important as the size of substrates and the effectiveness of single-wafer cleaning systems increased. The greater value per semiconductor wafer and the more delicate nature of the devices resulted in a transition in the industry toward single-wafer processing equipment.

An example of a single-wafer cleaning system that utilizes megasonic energy is disclosed in U.S. Pat. No. 6,039,059 ("Bran"), issued Mar. 21, 2000, and U.S. Pat. No. 7,100,304 ("Lauerhaas et al."), issued Sep. 5, 2006, the entireties of which are hereby incorporated by reference herein. The single-wafer cleaning system that is the subject of U.S. Pat. No. 6,039,059 and U.S. Pat. No. 7,100,304 is commercialized by Akrion, Inc. of Allentown. Pa. under the name GOLDFINGER®. Other examples of single-wafer cleaners that utilize acoustic energy are disclosed in U.S. Pat. No. 7,145,286 ("Beck et al."), issued Dec. 5, 2006, U.S. Pat. No. 6,539,952 ("Itzkowitz"), issued Apr. 1, 2003, and United States Patent Application Publication 200610278253 ("Verhaverbeke et al."), published Dec. 14, 2006. In single-wafer acoustic cleaning systems, such as the ones mentioned above, a semiconductor wafer is supported and rotated in horizontal orientation while a film of liquid is applied to one or both sides/surfaces of the wafer. A transducer assembly is positioned adjacent to one of the surfaces of the wafer so that a transmitter portion of the transducer assembly is in contact with the film of liquid by a meniscus of the liquid. The transducer assembly is activated during the rotation of the wafer, thereby subjecting the wafer to the acoustic energy generated by the transducer assembly.

Nonetheless, the industry's transition to the below 100 nm devices has resulted in additional challenges for manufacturers of semiconductor processing equipment. The cleaning process is no different. As a result of the devices becoming more and more miniaturized, cleanliness requirements have also become increasingly important and stringent. When dealing with reduced size devices, the ratio of the size of a contaminant compared to the size of a device is greater, resulting in an increased likelihood that a contaminated device will not function properly. Thus, increasingly stringent cleanliness and PRE requirements are needed. As a result, improved semiconductor wafer processing techniques that reduce the amount and size of the contaminants present during wafer production are highly desired.

As a result of these increasingly stringent cleanliness and PRE requirements, the removal of particles front both sides/surfaces of the wafer have been discovered by the present inventors to be playing an increasingly important role in achieving high yields. In existing single-wafer systems, removal of particles from both surfaces of the semiconductor wafer during a cleaning cycle are achieved by providing a single transducer assembly adjacent to one of the surfaces of the wafer. This transducer assembly is operated at a sufficient power level so that the generated acoustic energy passes through the wafer itself to loosen particles on the opposite surface of the wafer. This basic concept is one of the subject inventions of U.S. Pat. No. 6,039,059. This dual-sided cleaning concept is also shown as being utilized and copied in the system disclosed, in United. States Patent Application Publication 2006/0278253 ("Verhaverbeke et al.") with the transducer assembly located adjacent the backside of the wafer.

Despite these advancements in single-wafer systems and methods for cleaning both sides of the wafer, there still remains a need for single-wafer systems that can achieve improved PRE with minimized device damage. Furthermore, the continued miniaturization of devices continues to render existing cleaning systems incapable of achieving an acceptable balance between high PRE and minimized device damage.

SUMMARY OF THE INVENTION

It is therefore an object of the present invention to provide a system, apparatus and method for processing flat articles, such as semiconductor wafers, with acoustical energy.

Another object of the present invention is to provide a system, apparatus and method for simultaneously cleaning, both surfaces of flat articles, such as semiconductor wafers, with acoustical energy.

Still another object of the present invention is to provide a system, apparatus and method for simultaneously cleaning both surfaces of flat articles, such as semiconductor wafers, with acoustical energy that improves PRE and/or reduces damage to the flat article.

Yet another object of the present invention is to provide a system, apparatus and method for applying acoustical energy to the bottom surface of a rotating flat article.

A further object of the present invention is to provide a system, apparatus and method for simultaneously cleaning both surfaces of flat articles, such as semiconductor wafers, that utilize acoustic energy reflection.

A still further object of the present invention is to provide an apparatus and method that allows existing, single-wafer cleaners to be retrofitted to achieve improved cleaning of both surfaces of the wafer.

A yet further object of the present invention is to provide a system, apparatus and method that achieves increased liquid coupling between a transducer assembly and the bottom surface of a flat article.

Yet another object of the present invention is to provide a system, apparatus and method that increases the backside particle removal efficiency in a single-wafer cleaning system without increasing damage to devices located on the topside of the wafer.

Still another object of the present invention is to provide a system, apparatus and method for applying megasonic energy to the backside of a flat article.

These and other objects are filet by the present invention, which in one embodiment of the invention can be a system for processing flat articles comprising: a rotatable support for supporting a flat article; a first dispenser for applying liquid to a first surface of a flat article on the rotatable support; a second dispenser for applying liquid to a second surface of a flat article on the rotatable support; a first transducer assembly comprising: a first transducer for generating acoustic energy and a first transmitter acoustically coupled to the first transducer, the first transducer assembly positioned so that when the first dispenser applies liquid to the first surface of a flat article on the rotatable support, a first meniscus of liquid is formed between a portion of the first transmitter and the first surface of the flat article; and a second transducer assembly comprising a second transducer for generating acoustic energy and a second transmitter acoustically coupled to the second transducer, the second transducer assembly positioned so that when the second dispenser applies liquid to the second surface of the flat article on the rotatable support, a second meniscus of liquid is formed between a portion of the second transmitter and the second surface of the flat article.

In another embodiment, the invention can be a system for cleaning flat articles comprising: a rotatable support for supporting a flat article; a first transducer assembly comprising a first transducer and a first transmitter acoustically coupled to the first transducer, the first transducer assembly positioned so that a first small gap exists between a portion of the first transmitter and a first surface of a flat article on the rotatable support, a first meniscus of liquid being formed between the portion of the first transmitter and the first surface of the flat article when liquid is applied to the first surface; and a second transducer assembly comprising a second transducer and a second transmitter acoustically coupled to the second transducer, the second transducer assembly positioned so that a second small gap exists between a portion of the second transmitter and a second surface of the flat article on the rotatable support, a second meniscus of liquid being formed between the portion of the second transmitter and the second surface when liquid is applied to the second surface.

In yet another embodiment, the invention can be a system for processing flat articles comprising: a rotatable support for supporting and rotating a flat article in a substantially horizontal orientation; a transducer assembly comprising a transducer for generating acoustic energy, a transmitter acoustically coupled to the first transducer and a dam surrounding at least a portion of a perimeter of the transmitter so as to form a liquid retaining channel between the transmitter and the dam; and the transducer assembly positioned so that aportion of the transmitter is adjacent a bottom surface of a flat article on the rotatable support so that when liquid is applied to the bottom surface of the flat article, a meniscus of liquid is formed between the portion of the transmitter and the bottom surface of the flat article.

In still another embodiment, the invention can be a transducer assembly for mounting beneath a bottom surface of a flat article comprising: a transducer for generating acoustic energy; a transmitter acoustically coupled to the first transducer; and a dam surrounding at least a portion of a perimeter of the transmitter so as to form a liquid retaining channel between the second transmitter and the dam.

In a further embodiment, the invention can be a method of manufacturing a transducer assembly comprising: providing a par-cylindrical transmitter plate; bonding one or more transducers to a convex inner surface of the transmitter plate; connecting a housing to the transmitter to create an assembly having a substantially enclosed cavity in which the one or more transducers are located; and encapsulating the assembly with an inert non-reactive plastic.

In a yet further embodiment, the invention can be a method of processing a flat article comprising: a) supporting, a flat article in a substantially horizontal orientation within a gaseous atmosphere, the flat article having a bottom surface and a top surface; b) rotating the flat article while maintaining the substantially horizontal orientation; c) applying a film of liquid to the top surface of the flat article; d) applying a film of liquid on the bottom surface of the flat article; e) applying acoustic energy to the top surface of the flat article via a first transducer assembly comprising a first transducer and a first transmitter, a portion of the first transmitter in contact with the film of liquid on the top surface of the flat article; and f) applying acoustic energy to the bottom surface of the flat article via a second transducer assembly comprising a second transducer and a second transmitter a portion of the second transmitter in contact with the film of liquid on the bottom surface of the flat article.

In a still further embodiment, the invention can be a system for processing flat articles comprising: a rotatable support for supporting a flat article in a substantially horizontal orientation; a transducer assembly comprising a transducer for generating acoustic energy and a transmitter acoustically coupled to the transducer, the transducer assembly positioned so that a portion of the transmitter is adjacent a top surface of a flat article on the support so that a first meniscus of liquid is formed between the portion of the transmitter and the top surface when liquid is applied to the top surface; and a reflective member positioned so that a portion of the reflective member is adjacent a bottom surface of a flat article on the support so that a second meniscus of liquid is formed between a portion of the reflective member and the bottom surface when liquid is applied to the bottom surface; and the reflective member positioned so that at least a fraction of the acoustic energy that is generated by the first transducer assembly that passes through the flat article is reflected back toward the bottom surface of the flat article.

In yet another embodiment, the invention can be a system for processing flat articles comprising: a rotatable support for supporting a flat article in a gaseous atmosphere; a transducer assembly comprising a transducer and a transmitter bonded to the transducer, the transducer assembly positioned so that a first small gap exists between a portion of the transmitter and a first surface of a flat article on the support so that when liquid is applied to the first surface of the flat article, a first meniscus of liquid is formed between the portion of the transmitter and the first surface of the flat article a reflective member positioned so that a second small gap exists between a portion of the reflective member and a second surface of a flat article on the support so that when liquid is applied to the second surface of the flat article, a second meniscus of liquid is formed between the portion of the reflective member and the second surface of the flat article; and the reflective member positioned so that at least a fraction of the acoustic energy generated by the first transducer assembly that passes through the flat article is reflected back toward the second surface of the flat article by the reflector member.

In another embodiment, the invention can be a method of processing flat articles comprising: a) supporting a flat article in a substantially horizontal orientation within a gaseous atmosphere, the flat article having a bottom surface and a top surface; b) rotating the flat article while maintaining the substantially horizontal orientation; c) applying a film of liquid to the top surface of the flat article; d) applying a film of liquid on the bottom surface of the flat article; e) applying acoustic energy to the top surface of the flat article via a transducer assembly comprising a transducer and a transmitter, a portion of the transmitter in contact with the film of liquid on the top surface of the flat article; and f) reflecting the acoustic energy generated by the first transducer assembly that passes through the flat article hack toward the bottom surface of the flat article via a reflective member that is in contact with the film of liquid on the bottom surface of the flat article.

These and various other advantages and features of novelty that characterize the invention are pointed out with particularity in the claims annexed hereto and forming a part hereof. However, for a better understanding of the general technology, its advantages, and the objects obtained by its use, reference should be made to the drawings which form a further part hereof, and to the accompanying descriptive matter, in which there is illustrated and described a preferred embodiment of the invention.

DESCRIPTION OF THE INVENTION

Figure 1:
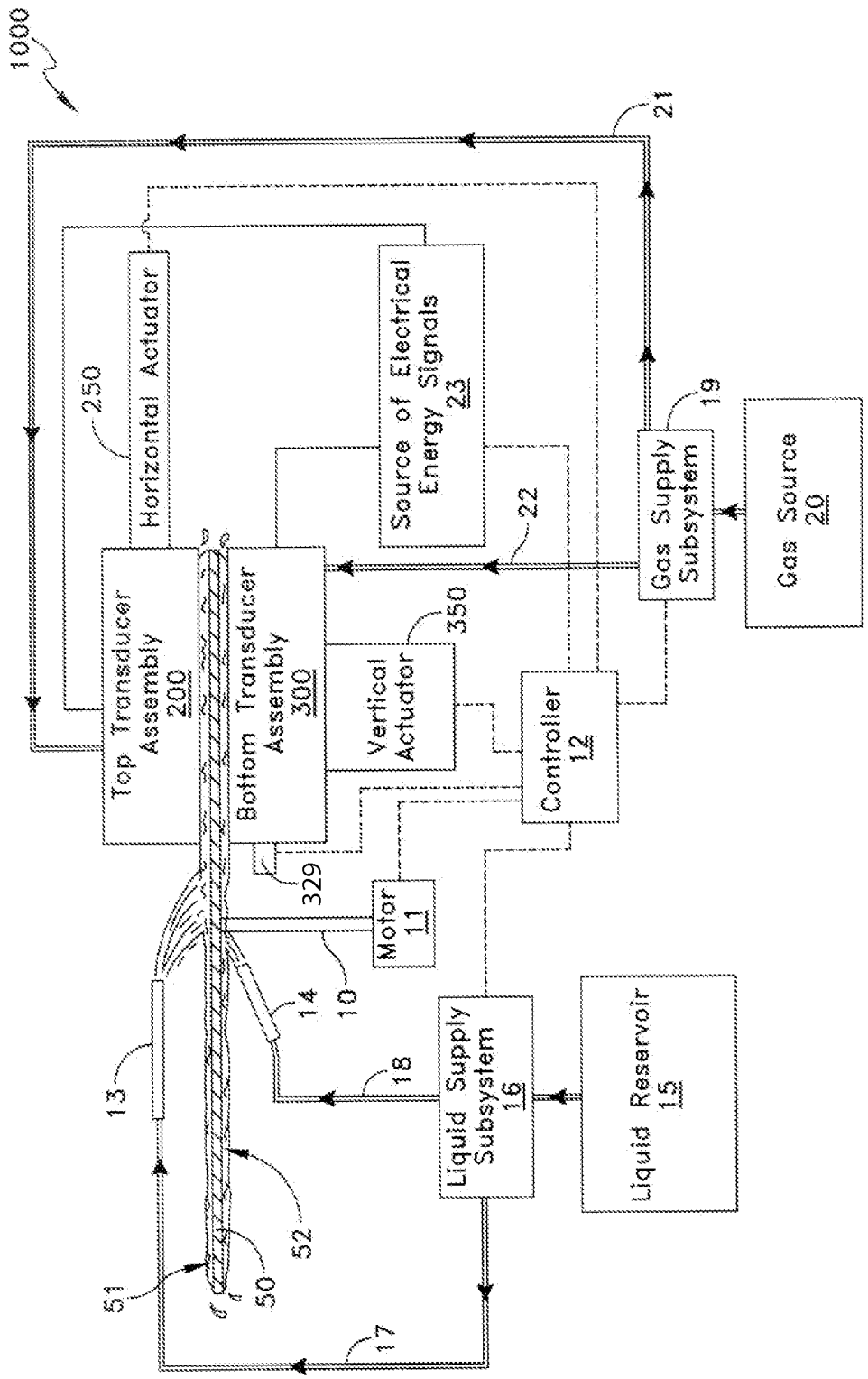
FIG. 1 is schematic of an acoustic energy cleaning system according, to one embodiment of the present invention.

Referring first to FIG. 1, a schematic of an acoustic energy cleaning system 1000 (hereinafter referred to as "cleaning system 1000") is illustrated according to one embodiment of the present invention. For ease of discussion the inventive system and methods of the drawings will be discussed in relation to the cleaning of semiconductor wafers. However, the invention is not so limited and can be utilized for any desired wet processing of any flat article.

The cleaning system 1000 generally comprises a top transducer assembly 200, bottom transducer assembly 300 and a rotatable support 10 for supporting a semiconductor wafer 50 in a substantially horizontal orientation. Preferably, the semiconductor wafer 50 is supported so its top surface 51 is the device side of the wafer 50 while the bottom surface 52 is the non-device side. Of course, the wafer can be supported so that its top surface 51 is the non-device side while the bottom surface 52 is the device side if desired.

The rotatable support 10 is designed to contact and engage only a perimeter of the substrate 50 in performing its support function. However, the exact details of the structure of the rotatable support 10 are not limiting of the present invention and a wide variety of other support structures can be used, such as chucks, support plates, etc. Additionally, while it is preferred that the support structure support and rotate the semiconductor wafer in a substantially horizontal orientation, in other embodiments of the invention, the system may be configured so that the semiconductor wafer is supported in other orientations, such as vertical or at an angle. In such embodiments; the remaining components of the cleaning system 1000, including the transducer assemblies 200, 300, can be correspondingly repositioned in the system so as to be capable of performing the desired functions and/or the necessary relative positioning with respect to other components of the system as discussed below.

The rotary support 10 is operably coupled to a motor 11 to facilitate rotation of the wafer 50 within the horizontal plane of support. Ile motor 11 is preferably a variable speed motor that can rotate the support 10 at any desired rotational speed ω. The motor 11 is electrically and operably coupled to the controller 12. The controller 12 controls the operation of the motor 11, ensuring that the desired rotational speed ω and desired duration of rotation are achieved.

The cleaning system 1000 further comprises a top dispenser 13 and a bottom dispenser 14. Both the top dispenser 13 and the bottom dispenser 14 are operably and fluidly coupled to a liquid supply subsystem 16 via liquid supply lines 17, 18. The liquid supply subsystem 16 is in turn fluidly connected to the liquid reservoir 15. The liquid supply subsystem 16 controls the supply of liquid to both the top dispenser 13 and the bottom dispenser 14.

The liquid supply subsystem 16, which is schematically illustrated as a box for purposes of simplicity, comprises the desired arrangement of all of the necessary pumps, valves, ducts, connectors and sensors for controlling the flow and transmission of the liquid throughout the cleaning system 1000. The direction of the liquid flow is represented by the arrows on the supply lines 17, 18. Those skilled in the art will recognize that the existence, placement and functioning of the various components of the liquid supply subsystem 16 will vary depending upon the needs of the cleaning system 1000 and the processes desired to be carried out thereon, and can be adjusted accordingly. The components of the liquid supply subsystem 16 are operably connected to and controlled by the controller 12.

The liquid reservoir 15 holds the desired liquid to be supplied to the wafer 50 for the processing that is to be carried out. For cleaning system 1000, the liquid reservoir 15 will hold a cleaning liquid, such as for example deionized water ("DIW"), standard clean 1 ("SC1"), standard clean 2 ("SC2"), ozonated deionized water ("DIO$_3$"), dilute or ultra-dilute chemicals, and/or combinations thereof. As used herein, the term "liquid" includes at least liquids, liquid-liquid mixtures and liquid-gas mixtures. It is also possible for certain other supercritical and/or dense fluids to qualify as liquids in certain situations.

Furthermore, it is possible to have multiple liquid reservoirs. For example, in some embodiments attic invention, the top dispenser 13 and the bottom dispenser 14 can be operably and fluidly coupled to different liquid reservoirs. This would allow the application of different liquids to the bottom surface 52 and the top surface 51 of the wafer 50 if desired.

The cleaning system 1000 further comprises a gas supply subsystem 19 that is operably and fluidly coupled to a gas source 20. The gas supply subsystem 19 is operably and fluidly connected to the top transducer assembly 200 via the gas supply line 21 and to the bottom transducer assembly 300 via the gas supply line 22. The gas supply subsystem 19, which is schematically illustrated as a box for purposes of simplicity, comprises the desired arrangement of all of the necessary pumps, valves, ducts, connectors and sensors for controlling the flow and transmission of the gas throughout the cleaning system 1000. The direction of the gas flow is represented by the arrows on the supply lines 21, 22. Those skilled in the art will recognize that the existence, placement and functioning of the various components of the gas supply subsystem 19 will vary depending upon the needs of the cleaning system 1000 and the processes desired to be carried out thereon, and can be adjusted accordingly. The components of the gas supply subsystem 19 are operably connected to and controlled by the controller 12. Thus, the transmission of gas from the gas supply subsystem 19 is based upon signals received from the controller 12.

As will be described in greater detail below, the gas is supplied to the top and bottom transducer assemblies 200, 300 to provide cooling and/or purging to the transducers in the assemblies 200, 300 that convert the electrical energy into the acoustic energy. The gas source 20 preferably holds an inert gas, such as nitrogen, helium, carbon dioxide, etc. However, the invention is not limited to the use of any specific gas. Furthermore, as with the liquids, it is possible to have multiple gas sources. For example, in some embodiments of the invention, the top transducer assembly 200 and the bottom transducer assembly 300 can be operably and fluidly coupled to different gas reservoirs. This would allow the application of different gases as desired.

The cleaning system 1000 further comprises a horizontal actuator 250 that is operably coupled to the top transducer assembly 200 and a vertical actuator 350 that is operably coupled to the bottom transducer assembly 300. The actuators 250, 350 are operably coupled to and controlled by the controller 12. The actuators 250, 350 can be pneumatic actuators, drive assembly actuators, or any other style desired to effectuate the necessary movement.

The horizontal actuator 250 can horizontally translate the top transducer assembly 200 between a retracted position and a processing position. When in the retracted position, the top transducer assembly 200 is withdrawn sufficiently away from the rotatable support 10 so that the wafer 50 can be loaded and unloaded without obstruction onto and from the support 10. When in the processing position, at least a portion of the top transducer assembly 200 is spaced from but sufficiently close to the top surface 51 of the wafer so that when liquid is supplied to the top surface 51 of the wafer 50, a meniscus of liquid is formed between the top surface 51 of the wafer 50 and that portion of the top transducer assembly 200. In FIG. 1, the top transducer assembly 200 is in the processing position.

Similarly, the vertical actuator 350 can vertically translate the bottom transducer assembly 300 between a retracted position and a processing position. For the bottom transducer assembly 300, the retracted position is a lowered position where the wafer 50 can be safely loaded onto the support 50 without contacting the bottom transducer assembly 300 and/ or interfering with other processes that may be carried out on the bottom surface 52 of the wafer 50 that require additional space. When the bottom transducer assembly 300 is in its processing position, at least a portion of the bottom transducer assembly 300 is spaced from but sufficiently close to the bottom surface 52 of the wafer 50 so that when liquid is supplied to the bottom surface 52 of the wafer 50, a meniscus of liquid is formed between the bottom surface 52 of the wafer 50 and that portion of the top transducer assembly 200. In FIG. 1, the bottom transducer assembly 300 is in the processing position.

While the actuators 250, 350 are exemplified in system 1000 as being horizontal and vertical actuators respectively, in other embodiments of the invention, different styles of actuators can be used in the place of each. For example the actuator operably coupled to the bottom transducer assembly 300 can be a horizontal, vertical, angled translation actuator or a pivotable actuator. The same options exist for the actuator operably coupled to the top transducer assembly 200.

A position sensor 329 is provided in the cleaning system 1000 so that the position of the bottom transducer assembly 300 can be monitored and controlled effectively. The position sensor 329 measures the distance between the bottom transducer assembly 300 and the bottom surface 52 of the wafer 50 so that the proper distance between the two can be achieved to effectuate the proper processing gap for formation of the liquid meniscus. The position sensor 329 is operably and communicably coupled to the controller 12. More specifically, the position sensor 329 generates a signal indicative of the measured distance and transmits this signal to the controller 12 for processing. While the sensor 329 is illustrated as being connected to the bottom transducer assembly 300, it can be mounted almost am where in the cleaning system 1000 so long as it can perform its position indicating function.

The cleaning system 1000 also comprises an electrical energy signal source 23 that is operably coupled to the top transducer assembly 200 and the bottom transducer assembly 300. The electrical energy signal source 23 creates the electrical signal that is transmitted to the transducers (discussed later) in the top transducer assembly 200 and the bottom transducer assembly 300 for conversion into corresponding acoustic energy. The desired electrical signals can be sent to the top and bottom transducer assemblies 200, 300 concurrently, consecutively and/or in an alternating fashion, depending on the process needs. The electrical energy signal source 23 is operably coupled to and controlled by the controller 12. As a result, the controller 12 will dictate the frequency, power level, and duration of the acoustic energy generated by the top transducer assembly 200 and the bottom transducer assembly 300. Preferably, the electrical energy signal source 23 is controlled so that the acoustic energy generated by the top transducer assembly 200 and the bottom transducer assembly 300 has a frequency in the megasonic range.

Depending on system requirements, it ma not be desirable to use a single electrical energy signal source to control both the top transducer assembly 200 and the bottom transducer assembly 300. Thus, in other embodiments of the invention, multiple electrical energy signal sources may be used, one for each transducer assembly.

The controller 12 may be a processor, which can be a suitable microprocessor based programmable logic controller, personal computer, or the like for process control. The controller 12 preferably includes various input/output ports used to provide connections to the various components of the cleaning system 1000 that need to be controlled and/or communicated with The electrical and/or communication connections are indicated, in dotted line in FIG. 1. The controller 12 also preferably comprises sufficient memory to store process recipes and other data, such as thresholds inputted by an operator, processing times, rotational speeds, processing conditions, processing temperatures, flow rates, desired concentrations, sequence operations, and the like. The controller 12 can communicate with the various components of the cleaning system 1000 to automatically adjust process conditions, such as flow rates, rotational speed, movement of the components of the cleaning system 1000, etc. as necessary. The type of system controller used for any given system will depend on the exact needs of the system in which it is incorporated.

The top dispenser 13 is positioned and oriented so that when a liquid is flowed therethough, the liquid is applied to the top surface 51 of the substrate 50. When the substrate 50 is rotating, this liquid forms a layer or film of the liquid across the entirety of the top surface 51 of the substrate 50. Similarly, the bottom dispenser 14 is positioned and oriented so that when a liquid is flowed therethough, the liquid is applied to the bottom surface 52 of the substrate 50. When the substrate 50 is rotating, this liquid forms a layer or film of the liquid across the entirety of the bottom surface 52 of the substrate 50.

The top transducer assembly 200 is positioned so that a small gap exists between a portion of the top transducer assembly 200 and the top surface of the wafer 50. This gap is sufficiently small so that when the liquid is applied to the top surface 51 of the wafer 50, a meniscus of liquid is formed between the top surface 51 of the wafer 50 and the portion of the top transducer assembly 200. Similarly, the bottom transducer assembly 300 is positioned so that a small gap exists between a portion of the bottom transducer assembly 300 and the bottom surface 52 of the wafer 50. This gap is sufficiently small so that when the liquid is applied to the bottom surface 52 of the wafer 50, a meniscus of liquid is formed between the bottom surface 52 of the wafer 50 and the portion of the bottom transducer assembly 390. The meniscus is not limited to any specific shape.

As will be noted, the top and bottom transducer assemblies 209, 300 are generically illustrated as boxes. This is done because, in its broadest sense, the invention is not limited to any particular structure, shape and/or assembly arrangement for the transducer assemblies 200, 300. For example, any of the transducer assemblies disclosed in U.S. Pat. No. 6,039,059 ("Bran"), issued Mar. 21, 2000, U.S. Pat. No. 7,145,286 ("Beck et al."), issued Dec. 5, 2006, U.S. Pat. No. 6,539,952 ("Itzkowitz"), issued Apr. 1, 2003, and United States Patent Application Publication 2006/0278253 ("Verhaverbeke et al."), published Dec. 14, 2006, can be used as the top and/or bottom transducer assembly 200, 300. Of course, other styles of transducer assemblies can be used, such as those having an elongated transmitter rod supported at an angle to the surface of the wafer.

Figure 2:
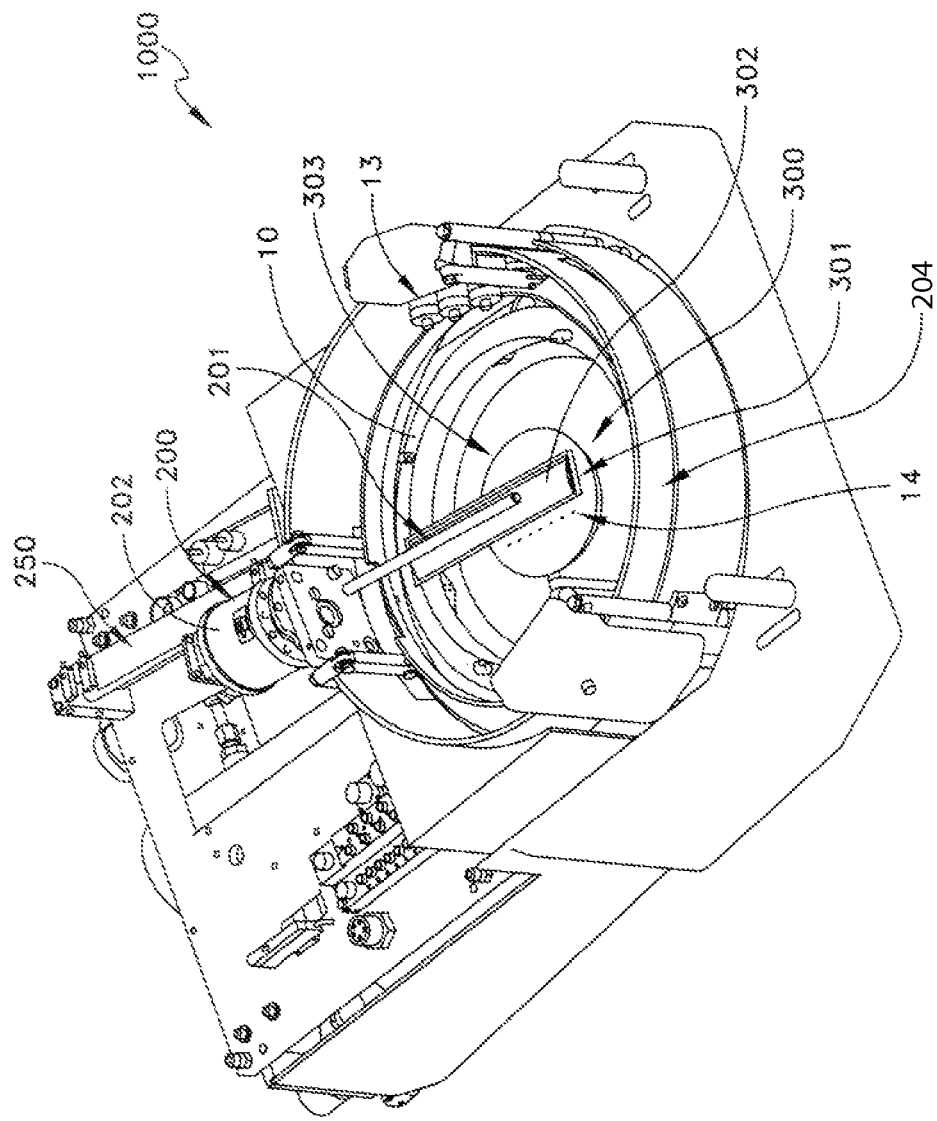
FIG. 2 is a perspective view of one structural embodiment of the acoustic energy cleaning system of FIG. 1.

Referring now to FIG. 2, a preferred structural embodiment of the cleaning system 1009 is illustrated. Like numbers are used in FIGS. 2-14 to indicate the corresponding structural manifestation of the schematically illustrated components of FIG. 1.

In the cleaning system 1099 of FIG. 2, the top transducer assembly 200 comprises an elongate rod-like transmitter 201 that is acoustically coupled to a transducer 203 (visible in FIG. 3) that is located within housing 202. Many of the details of this style of elongate rod-like transmitter 201 are disclosed in U.S. Pat. No. 6,684,891 ("Bran"), issued Feb. 3, 2004 and U.S. Pat. No. 6,892,738 ("Bran et al."), issued May 17, 2005, the entireties of which are hereby incorporated by reference. The top transducer assembly 204) is operably coupled to drive assembly/actuator 250 that can move the rod-like transmitter 201 between a retracted position and a processing position. When the rod-like transmitter 201 is in the retracted position, the rod-like transmitter 201 is located outside of the process bowl 204 so that a wafer 50 can be placed on the rotatable support 10 without obstruction. More specifically, the drive assembly 259 withdraws the rod-like transmitter 201 through an opening in a side wall of the process bowl 204. When in the processing position, the rod-like transmitter 201 is position directly above the top surface 51 of a wafer 50 on the rotatable support 10. The rod-like transmitter 201 is in the processing position in FIG. 2.

The bottom transducer assembly 300 is located at the bottom of the process bowl 204, at a position below the rotatable support 10. The bottom transducer assembly 300 comprises a dam 301, a transmitter 302 and a base 303. The bottom dispenser 14 is in the form of a plurality of sprayers located within the base 303 itself, rather than a single nozzle dispenser.

Figure 3:
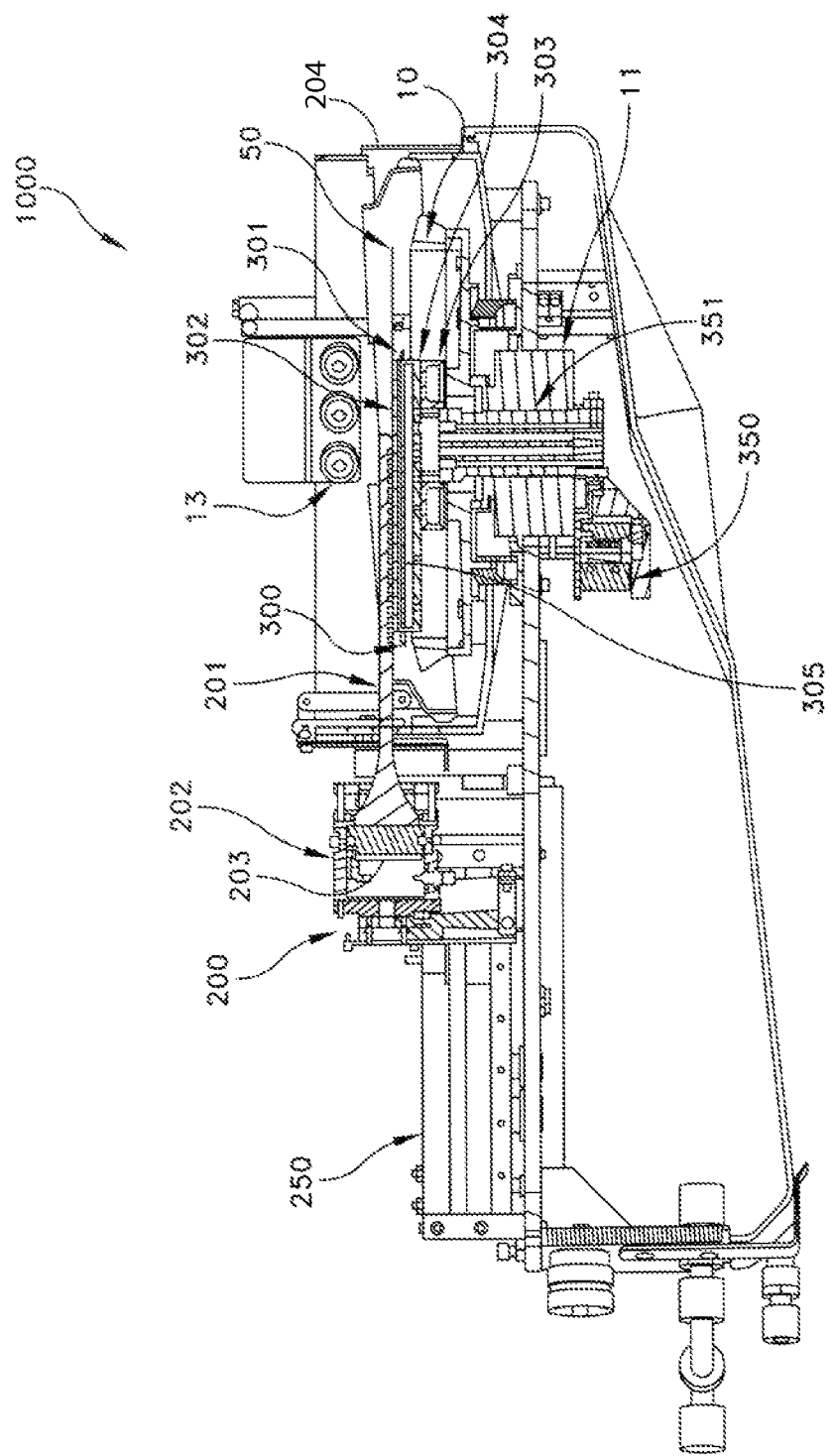
FIG. 3 is a cross-sectional side view of the acoustic energy cleaning system of FIG. 2.

Referring now to FIG. 3, it can be seen that the rotatable support 10 is located within the process bowl 204. The rotatable support 10 supports a wafer 50 in a substantially horizontal orientation in the gaseous atmosphere of the process bowl 204, which surrounds the periphery of the wafer 50. The rotatable support 10 is operably connected to the motor assembly 11. The motor assembly rotates the wafer about the central axis. The motor assembly 11 can be a direct drive motor or a bearing with offset belt/pulley drive.

The rotatable support 10 supports the wafer 50 at an elevation and position between the elongate rod-like transmitter 201 of the top transducer assembly 200 and the transmitter 302 of the bottom transducer assembly 300. When the wafer 50 is so supported, the transmitter 201 of the top transducer assembly 200 extends in a substantially parallel orientation over the top surface 51 of the wafer 50 in a close spaced relation. Similarly, the transmitter 302 of the bottom transducer assembly 300 extends in a substantially parallel orientation below the bottom surface 52 of the wafer 50 in a close spaced relation. These close spaced relations are such that when liquid is applied to the top and bottom sin laces 51, 52 from the dispensers 13, 14 respectively, meniscuses of liquid are respectively formed between a portion of the transmitter 201 and the top surface 51 of the wafer 50 and between a portion of the transmitter 302 and the bottom surface 52 of the wafer 50.

The bottom transducer assembly 300 is operably connected to the lifter/actuator 350. The lifter/actuator 350 can be a pneumatic lifter and can also comprise brackets. The lifter 350 can move the bottom transducer 300 assembly between a processing position and a retracted position. In FIG. 3, the bottom transducer assembly 300 is in the processing position, which is a raised position in which the transmitter 302 is in the close spaced relation discussed above. When in the retracted position, the bottom transducer assembly 300 is in a lowered, position to ensure that the wafer 50 is not damaged during insertion onto the rotatable support 10.

The transducers 203, 305 of the top and bottom transducer assemblies 200, 300 are acoustically coupled to the transmitter 201, 302 respectively. This can be done through a direct bonding or an indirect bonding that utilizes intermediary transmission layers. The transducers 230, 305 are operably coupled a source of an electrical energy signal. The transducers 203, 305 can be a piezoelectric ceramic or crystal, as is well known in the art.

Referring now to FIGS. 4-7 concurrently, the bottom transducer assembly 300 is illustrated removed from the cleaning system 1000 so that its details are visible. It should be understood that the bottom transducer assembly 300, in of itself, is a novel device that can constitute an embodiment of the invention.

The bottom transducer assembly 300 comprises a base structure 303, a housing 304, a transmitter 302, a transducer 305 and a dam 301. The base structure 303 is preferably made of PTFE or other non-contaminating material that is suitable rigid. The base structure 303 has a top convex surface that is a generally par-spherical shaped. The base structure 303 connects to and supports the remaining components of the bottom transducer assembly 300. The base structure 303 also comprises a plurality of liquid dispensing holes/nozzles 14 that are adapted to supply a film of liquid to the bottom surface of a wafer during processing. The holes/nozzles 14 are located on both sides of the transmitter 302 in two separate rows that extend along the length of the transmitter 302.

The transmitter 302 is a generally par-cylindrical shaped plate having a convex outer surface 306 and a concave inner surface 307. The transmitter 302, however, can take on a wide variety of other shapes and sizes. The transmitter 302 can be constructed of any material that transmits acoustic energy generated by the transducer 305, including without limitation quartz, sapphire, boron nitride, plastic, and metals. One suitable metal is aluminum.

The outer convex surface of the transmitter 302 terminates in an apex 313. Because the transmitter 302 is a par-cylindrical shape, this apex 313 (FIG. 7) forms an elongate edge along 314 along the length of the transmitter. Of course, as used herein, the term elongate edge is not limited to the apex of an elongated curved surface but also includes, among other things, the meeting of two surfaces. Furthermore, in other embodiments, the transmitter 302 may be spherical in nature, thus, the apex could be a point.

The transducer 305 is a curved plate having a convex upper surface 308 and concave lower surface 309. The construction of transducers that convert electrical energy into acoustical energy is very well known in the art. The convex surface 308 of the transducer has a curvature that generally corresponds to the curvature of the inner concave surface 307. The transducer 305 is acoustically coupled to the transmitter 302 so that acoustic energy generated by the transducer 305 propagates through the transmitter 302 and to the wafer 50. More specifically, the convex upper surface 308 of the transducer 305 is bonded to the concave inner surface 307 of the transmitter. This bonding can be a direct bonding between the surfaces 307, 308 or can be an indirect bonding utilizing intermediary transmission layers. In other embodiments, the transducers may be flat plates or other shapes. Moreover, while the bottom transducer assembly 300 is illustrated as utilizing a single transducer 305, a plurality of transducers can be used if desired to create the acoustic energy. Preferably, the transducer 305 is adapted to generate megasonic energy.

The transmitter 302 is connected to the housing 394 so as to form a substantially enclosed space 310 in which the transducer 305 is located. Any suitable means can be used to connect the housing 304 to the transmitter 302, including adhesion, heat welding, fasteners or a tight-fit assembly. A plurality of openings 311 are provided in the bottom portion of the housing 304. The openings 311 are provided to allow a gas to be introduced into and/or out of the space 310 so that the transducer 305 can be cooled and/or purged. The openings 311 are operably connected to the gas source 20 as described in FIG. 1. The housing 304 also comprises an opening 312 for allowing the electrical connections (i.e. wires) that are necessary to power the transducer 305 to pass into the space 310. This opening 312 can also be used to allow the gas to escape the space 310. The housing 304 can take on a wide variety of shapes and structures and is not limiting of the present invention. In some embodiments, the housing may be merely a plate or other simple structure.

In order to further protect the wafer 50 from possible contamination, once the transmitter 302 is connected to the housing 304, the combined assembly may be fully encapsulated with an inert non-contaminating plastic such as TEFLON® or the like. This also serves to protect the transmitter 302 from chemical attack. When the transmitter 302 is so encapsulated and/or coated, the encapsulation and/or coating is considered part of the transmitter 302.

Figure 4:
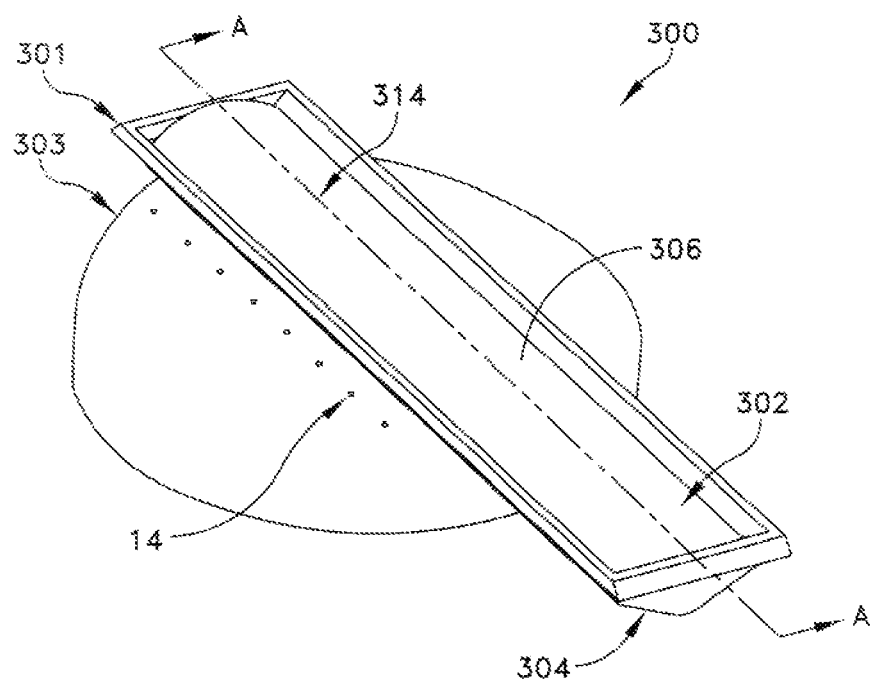
FIG. 4 is a transducer assembly according to one embodiment of the present invention that is utilized in the acoustic energy cleaning system of FIG. 2 as the bottom-side transducer assembly.
Figure 5:
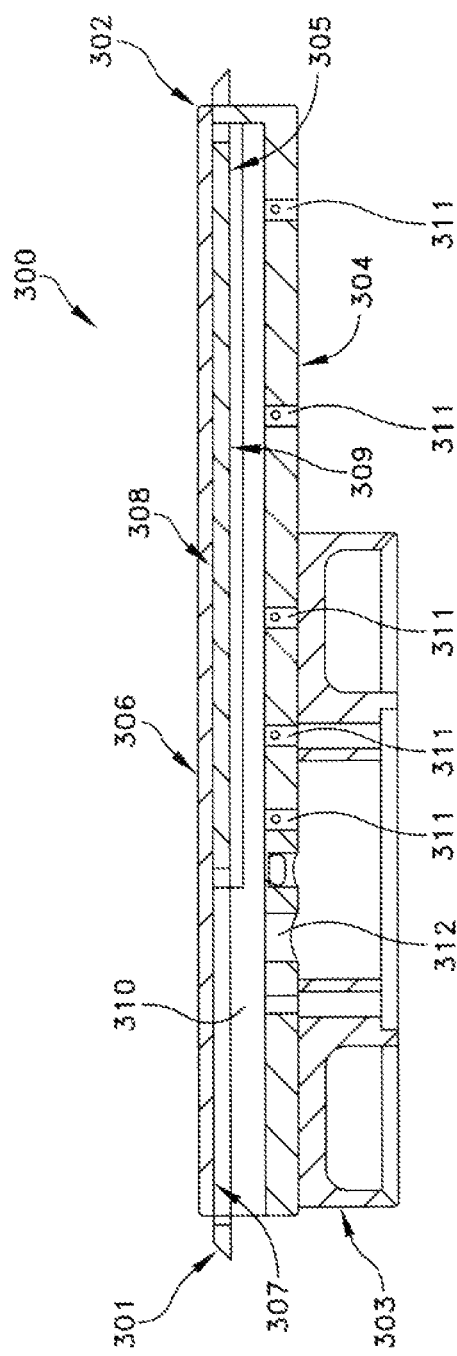
FIG. 5 is a cross-sectional view of the transducer assembly of FIG. 4 along cross-section cut AA of FIG. 4.
Figure 6:
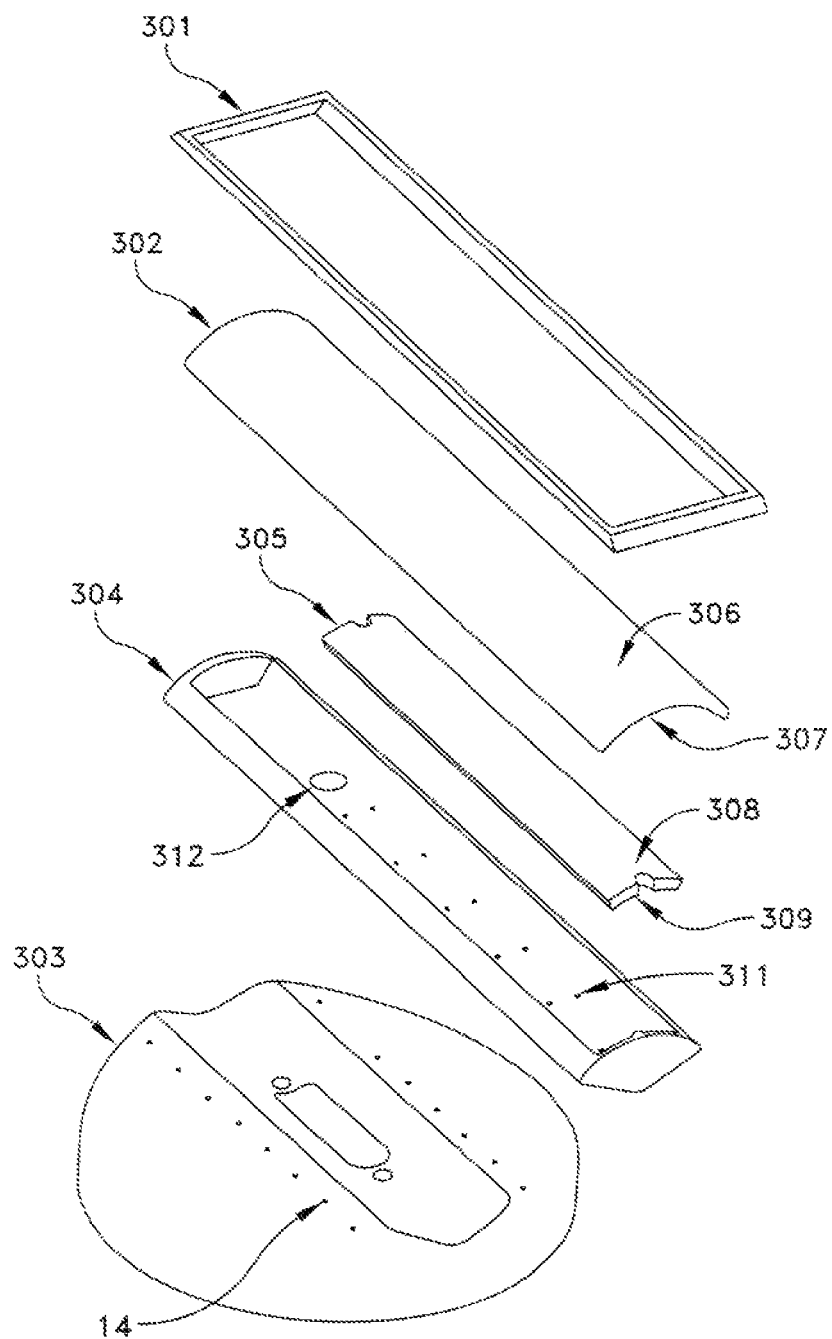
FIG. 6 is an exploded view of the transducer assembly of FIG. 4.
Figure 7:
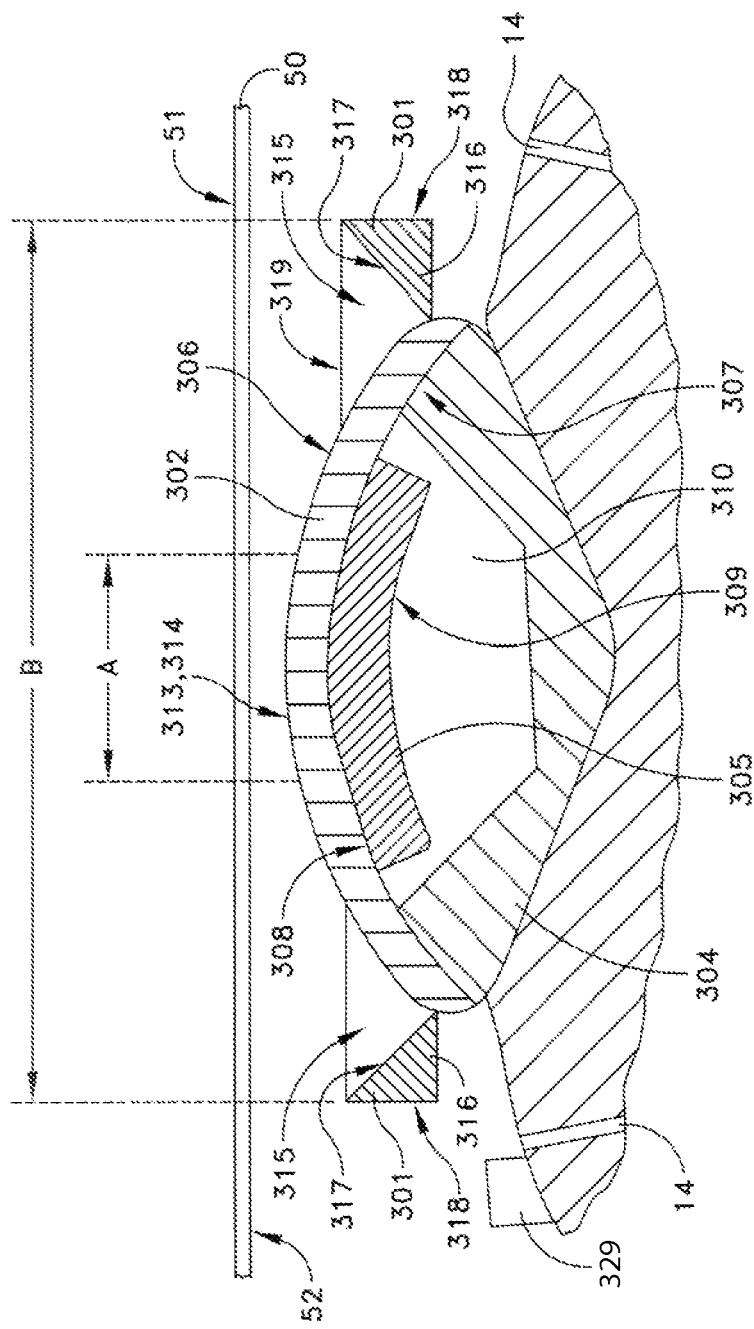
FIG. 7 is a schematic of the transducer assembly of FIG. 4 positioned adjacent a bottom surface of a semiconductor wafer according to an embodiment of the present invention wherein the transducer assembly of FIG. 4 is shown in cross-section.

Referring exclusively to FIGS. 4 and 7, the bottom transmitter assembly 300 further comprises a dam 301 that surrounds the periphery/perimeter of the transmitter 302. The dam 301 forms an upwardly protruding ridge 316 having an angled inner surface 317, an outer surface 318 and a top edge 319. The dam 301 forms a liquid retaining channel 315 on both sides of the transmitter 302. More specifically, the inner surface 317 of the ridge 316 forms a channel/groove with the transmitter 302. Of course, in some embodiments, the dam 301 could be used to form the channel 315 in other ways and/or through cooperation with other structures.

The dam 301 is a rectangular frame-like structure but can take on other shapes. The dam 301 also does not have to surround the entire periphery of the transmitter 302 but can surround only a small portion if desired. The darn 301 can be constructed of HDPE, PVDF, NPP or any other material. Preferably, the material chosen is chemically resistant and mechanically stable.

The dam 301 is implemented into the bottom transducer assembly 300 to increase the size of the meniscus that couples the transmitter 302 to the bottom surface 52 of the wafer 50. This facilitates an increased amount of acoustic energy being transmitted to the wafer 50 for improved cleaning. As illustrated in FIG. 7, without the darn 301, the meniscus couples only area. A of the transmitter 302 to the wafer 50. However, with the dam 301, the meniscus coupling area is increased to area B.

Referring now to FIGS. 8-12, the possibilities for the relative arrangement of the bottom transducer assembly 300 and the top transducer assembly 200 with respect to one another in the cleaning system 1000 will be discussed.

Figure 8:
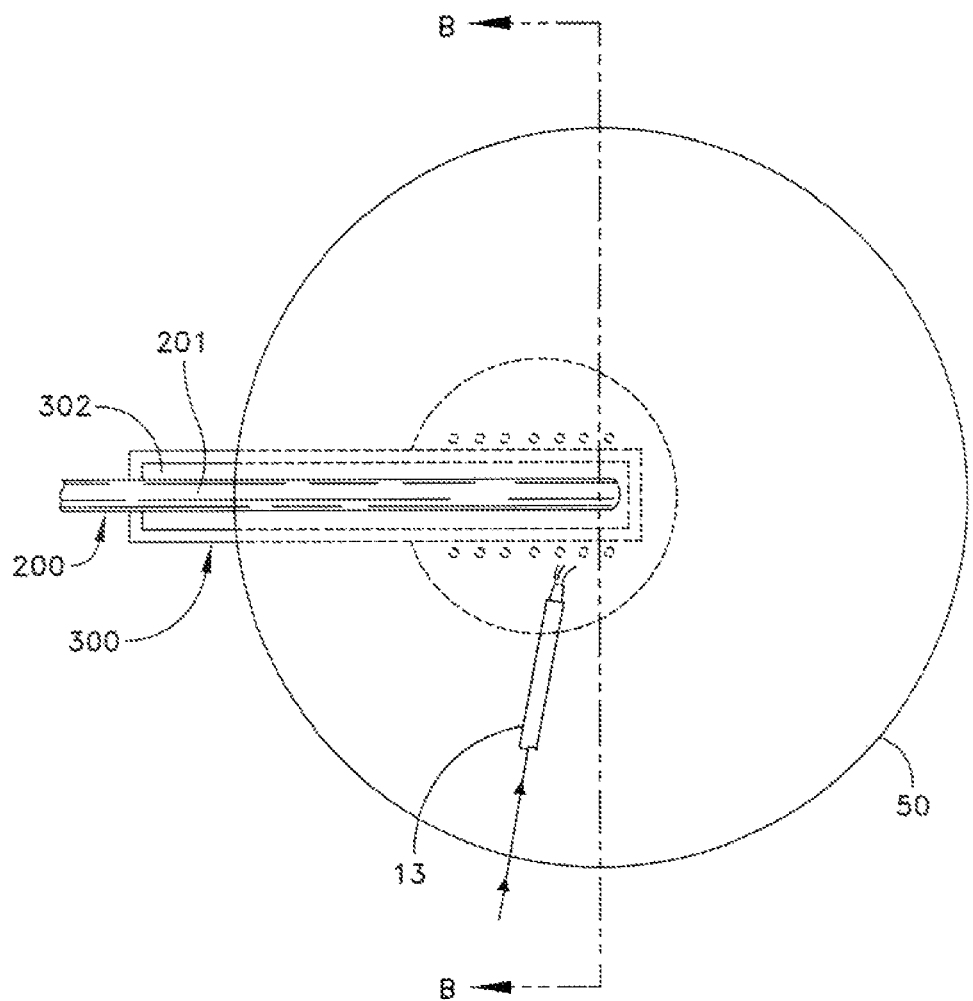
FIG. 8 is a schematic representation of one arrangement of the topside transducer assembly relative to the bottom-side transducer assembly for the acoustic energy cleaning, system of FIG. 2.
Figure 9:
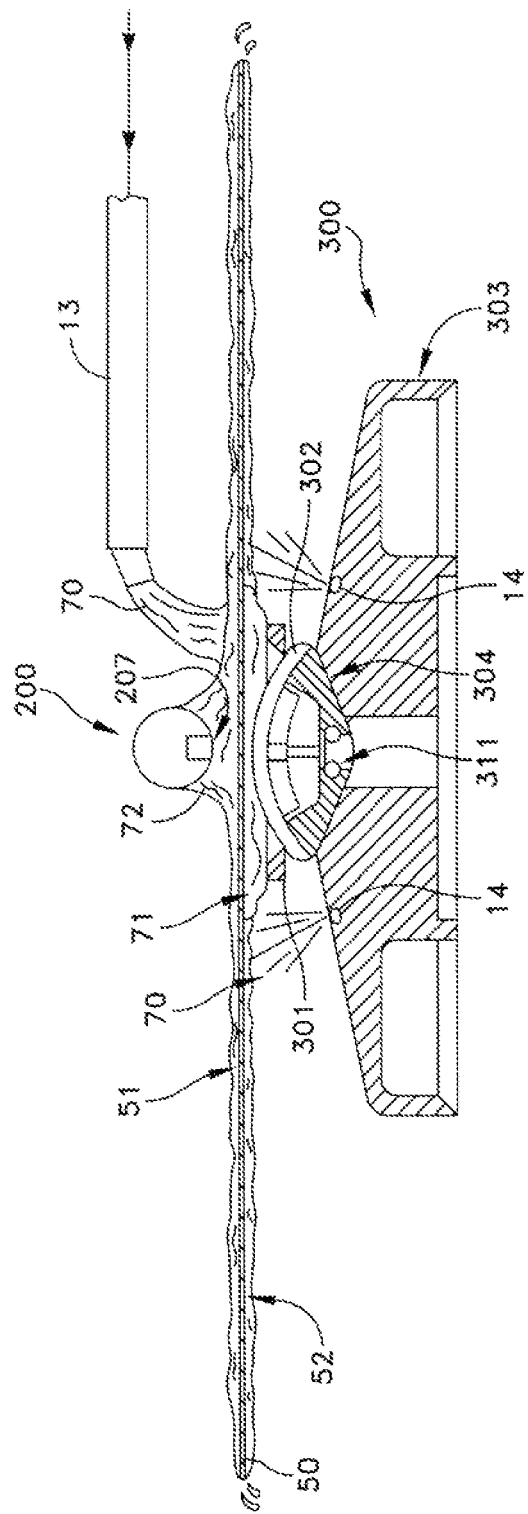
FIG. 9 is a cross-sectional view of the schematic representation of the transducer assembly arrangement of FIG. 8 along the cross-section cut B-B of FIG. 8.

Referring first to FIGS. 8 and 9, an arrangement is illustrated wherein the transmitter 201 of the top transducer assembly 200 is aligned with and opposes the transmitter 302 of the bottom transducer assembly 300. A wafer 50 is illustrated as being in between the assemblies 200, 300. As liquid 70 is applied to the top surface 51 of the wafer 50, a meniscus of liquid 72 is formed between a bottom portion 207 of the transmitter 201 of the top transducer assembly 200 and the top surface 51 of the wafer 50. Similarly, as liquid 70 is applied to the bottom surface 52 of the wafer 50, a meniscus of liquid 71 is formed between the transmitter 302 of the bottom transducer assembly 300 and the bottom surface 52 of the wafer 50. As can be seen, the coupled portions of the top transmitter 201 and the bottom transmitter 302 oppose one another in an aligned manner. As a result, it is possible that the acoustic energy is generated by the top and bottom transducer assemblies 200, 300 and transmitted to the wafer via the meniscuses 71, 72 can interfere with and/or cancel one another out.

Thus, it may be desirable, in certain instances, to operate the top and bottom transducer assemblies 200, 300 in an alternating and/or consecutive manner during a wafer cleaning cycle. In other embodiments, one may want to activate the operate the top and bottom transducer assemblies 200, 300 concurrently if interference is not an issue.

Figure 10:
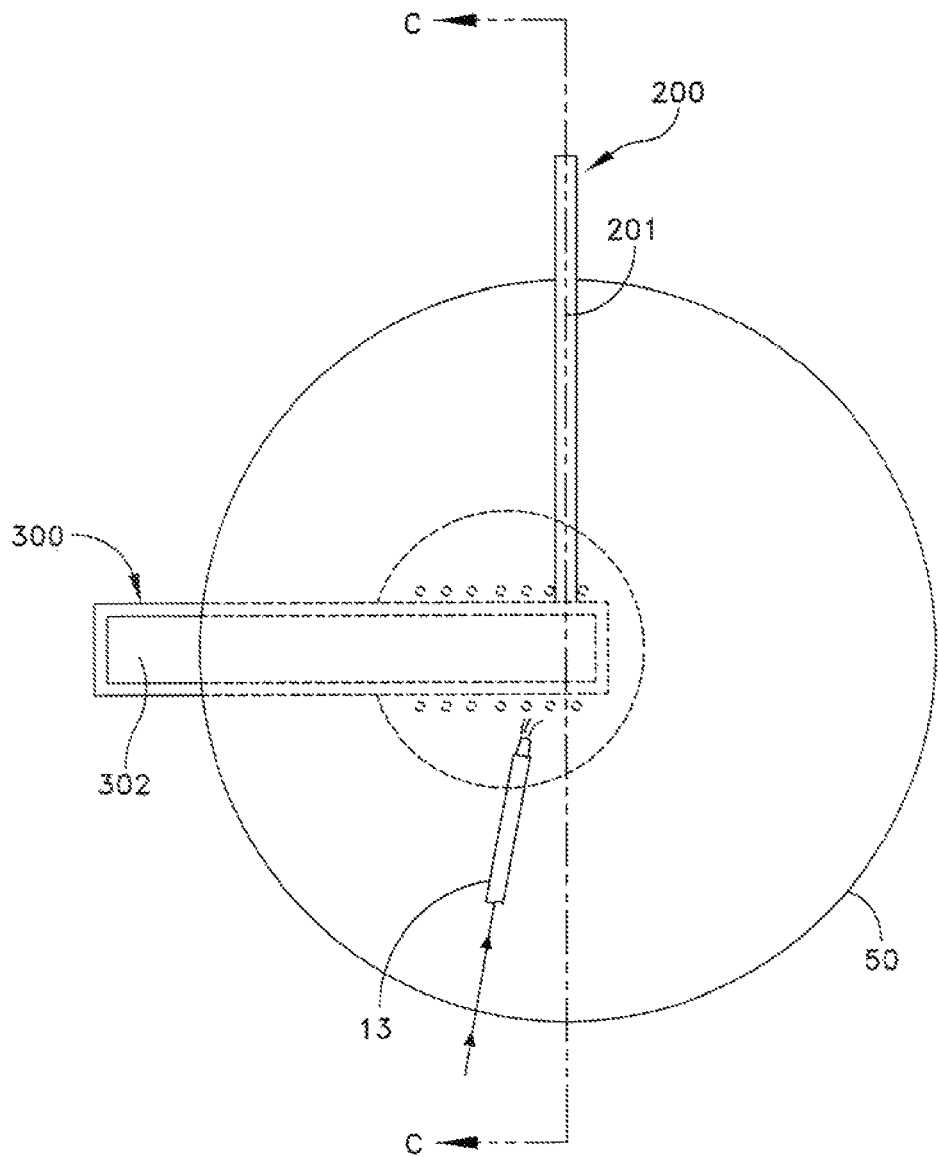
FIG. 10 is a schematic representation of an alternative arrangement of the topside transducer assembly relative to the bottom-side transducer assembly for the acoustic energy cleaning system of FIG. 2.
Figure 11:
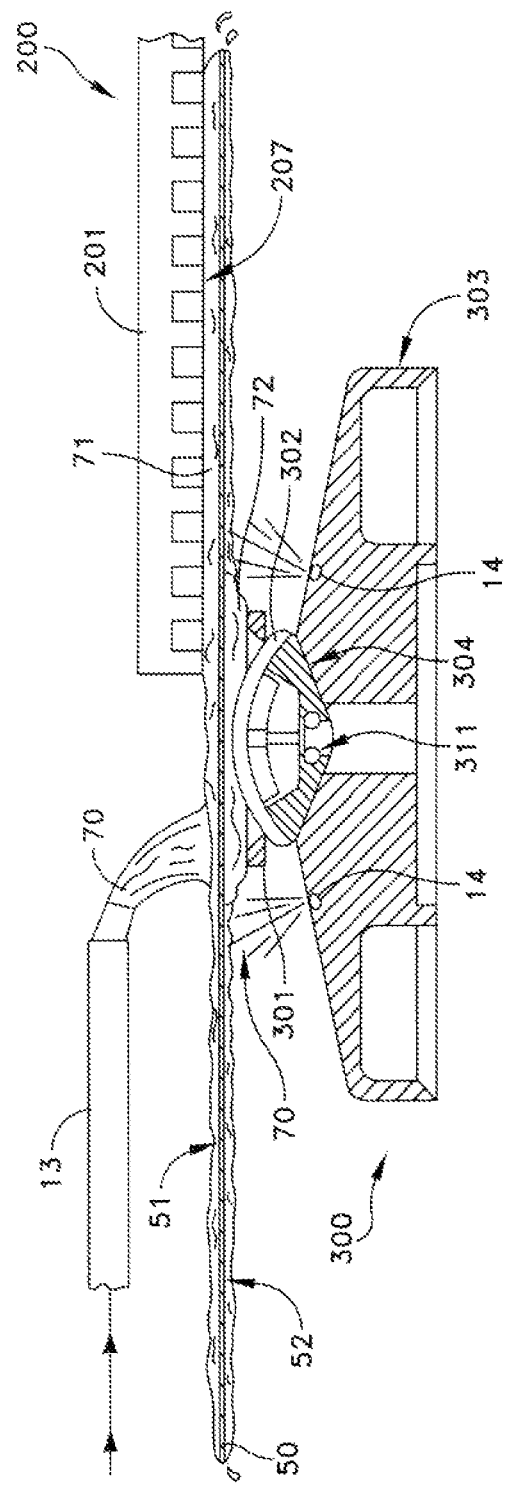
FIG. 11 is a cross-sectional view of the schematic representation of the alternative transducer assembly arrangement of FIG. 10 along the cross-section cut C-C of FIG. 8.

Referring now to FIGS. 10 and 11 concurrently, an alternative relative arrangement of the bottom transducer assembly 300 and the top transducer assembly 200 with respect to one another in the cleaning system 1000 is illustrated. In this embodiment, the transmitters 201, 302 of the top and bottom transducer assemblies 200, 300 are not aligned and do not oppose one another. Thus, interference should not be a problem during simultaneous generation and transmission of acoustic energy to the wafer. While the horizontal angle of separation between the top and bottom transmitters 201, 302 is 90 degrees in the illustration, any other angle can be used, including without limitation 180 degrees, 45 degrees, etc.

It was discovered during the creation of the above described system that improved cleaning results were achieved by just having the bottom transducer assembly 300 present in the cleaning system 1000 and arranged as shown in FIG. 8, even when not activated (i.e., passive). It was discovered that the transmitter 302 of the bottom transducer assembly 300 was reflecting at least a fraction of the acoustic energy that was generated by the top transducer assembly 200 back toward the bottom surface 51 of the wafer 50. Therefore, in another aspect, the invention is a novel system that utilizes a passive reflective member coupled to the opposite surface of the wafer than the active transducer assembly.

Figure 12:
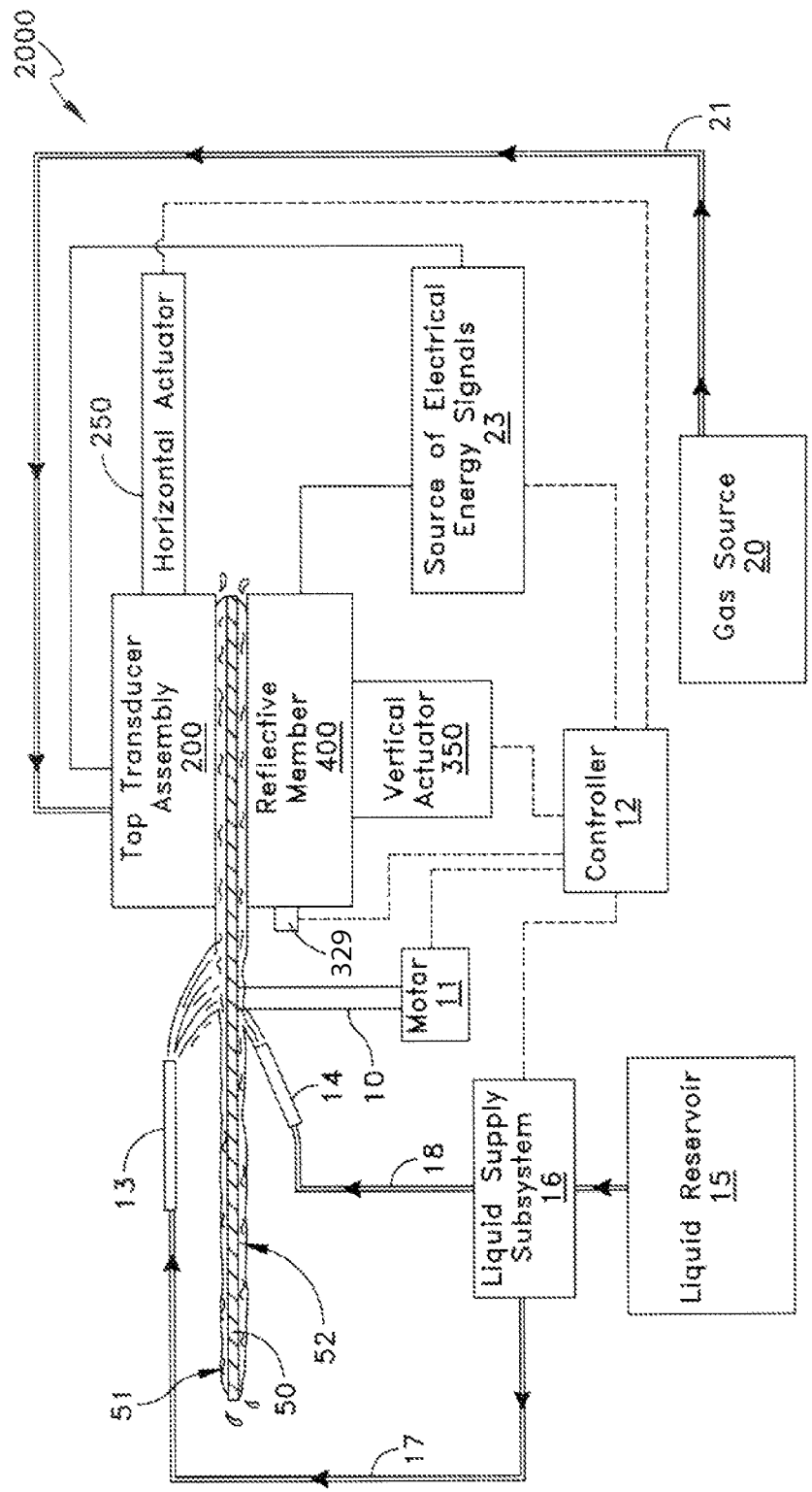
FIG. 12 is schematic of an acoustic energy cleaning system utilizing a reflective member according to one embodiment of the present invention.

Referring now to FIG. 12, a cleaning system 2000 that utilizes a passive backside reflective member 400 is schematically illustrated. The cleaning system 2000 is identical to that of cleaning system 1000 except that the bottom transducer assembly is replaced by a reflective member 400. In fact, in some embodiments, the reflective member 400 could be a transducer assembly, such as the one described above, that is not activated. However, the reflective member 400 is not so limited and can take on a much broader variety of structures. Thus, a detailed explanation of the cleaning system 2000 will be omitted with the understanding that the description of cleaning system 1000 above will suffice for like parts. Like numbers are used to reference like parts.

The reflective member 400 could be a mere plate or other structure. Preferably, the reflective member 400 is made of a material that has an acoustical impedance value (Za) that is much greater than that of water. In one embodiment, it is preferred that the acoustical impedance value be at least greater than 5.0 Mrayl; such as quartz. It may also be preferred that the reflective member 400 be spaced from the surface of the wafer 50 to which it is fluidly coupled by a distance that is a one-fourth interval of the wavelength of the acoustic energy being generated by the top transducer assembly 200. In some alternative embodiments the reflective member 400 may be used to absorb the acoustical energy instead of reflecting it.

The reflective member 400 may be made of a variety of materials the selection of which is dependent upon whether or not it is intended to be used as a reflector or an absorber of the acoustical energy. In the embodiment shown in FIGS. 12 and 13 the reflective member 490 is designed to reflect acoustical energy. The reflective member 400 may be made of materials such as quartz, sapphire, silicone carbine, or boron nitride. Should acoustical energy wish to be absorbed the member 400 can be constructed out of PolyVinylidine Difluoride (PVDF) or polytetrafluoroethylene (PTFE) (Also commonly sold under the trade name TEFLON®). The materials chosen are based upon their respective acoustical impedance (Za). Table 1 (below) provides a list, of materials and the Zas associated with them.

TABLE 1

| Material | Za |
| --- | --- |
| Alumina | 40.6 |
| Aluminum rolled | 17.33 |
| ARALDITE ® 502/956 20 phe | 3.52 |
| ARALDITE ®502/956 50 phe | 4.14 |
| ARALDITE ®502/956 90 phe | 12.81 |
| Beryllium | 24.10 |
| Bismuth | 21.5 |
| Brass 70cu 30 Zn | 40.6 |
| Brick | 7.4 |
| Cadmium | 24 |
| Carbon vitreous, sigradur K | 7.38 |
| Concrete | 8.0 |
| Copper rolled | 44.6 |
| Duraluminum 17S | 17.63 |
| EPOTEK ® 301 | 2.85 |
| Fused silica | 12.55 |
| Germanium | 29.6 |
| Glass pyrex | 13.1 |
| Glass quartz | 12.1 |
| Glass silica | 13 |
| Glucose | 5.0 |
| Gold | 63.8 |
| Granite | 26.8 |
| Indium | 18.7 |
| Iron | 46.4 |
| Iron cast | 33.2 |
| Lead | 24.6 |
| Lithium | 33.0 |
| Magnesium | 10.0 |
| Marble | 10.5 |
| Molybdenum | 63.1 |
| Nickel | 49.5 |
| Paraffin | 1.76 |
| Polyester casting resin | 2.86 |
| Porcelain | 13.5 |
| PVDF | 4.2 |
| Quartz x cut | 15.3 |
| Rubidium | 1.93 |
| Salt crystalline x direction | 10.37 |
| Sapphire, aluminum oxide | 44.3 |
| SCOTCH ® tape 2.5 mils thick | 2.08 |
| Silicon very anisotropic approx | 19.7 |
| Silicon carbide | 91.8 |
| Silicon nitride | 36 |
| Silver | 38.0 |
| Steel mild | 46.0 |
| Steel stainless | 45.7 |
| STYCAST ® | 2.64 |
| Tantalum | 54.8 |
| TEFLON ® | 2.97 |
| Tin | 24.2 |
| Titanium | 27.3 |
| Tracon | 4.82 |
| Tungsten | 101.0 |
| Uranium | 63.0 |
| Vanadium | 36.2 |
| Wood cork | 0.12 |
| Wood pine | 1.57 |
| Zinc | 29.6 |
| Zinc oxide | 36.4 |
| Zirconium | 30.1 |

The acoustical impedance Za of a material is defined as the product of the density of that material times the velocity of sound in that material. The units for Za are Mrayl or (kg/m²s×10⁶). Acoustical energy transmission is affected by the differences in the Za of the materials through which the acoustical energy must pass. More specifically, large differences in the Za between adjacent materials through which the acoustical energy must pass results in increased impedance of the acoustical energy.

Due to the acoustical impedance values of the various surfaces of the reflective member 400, the acoustical energy is effectively transmitted back towards the wafer 50. This effectively cleans the bottom surface 52 without having to provide additional transducers. As discussed above, the reflective member 400 is made of a material with a Za that is greater than the fluid through which the acoustical energy is transmitted. Preferably the Za should be greater than 5 Mrayl, and more preferably greater than 15 Mrayl, such as quartz. The reflective member 400 may be hollow in order to create an additional transitional space that causes the acoustical energy to be reflected again as it passes through the reflective member 400. During the cleaning process there may be continuous reflection between the wafer 50 and the reflective member 409 and it may continue until the acoustical energy diminishes in the system.

Figure 13:
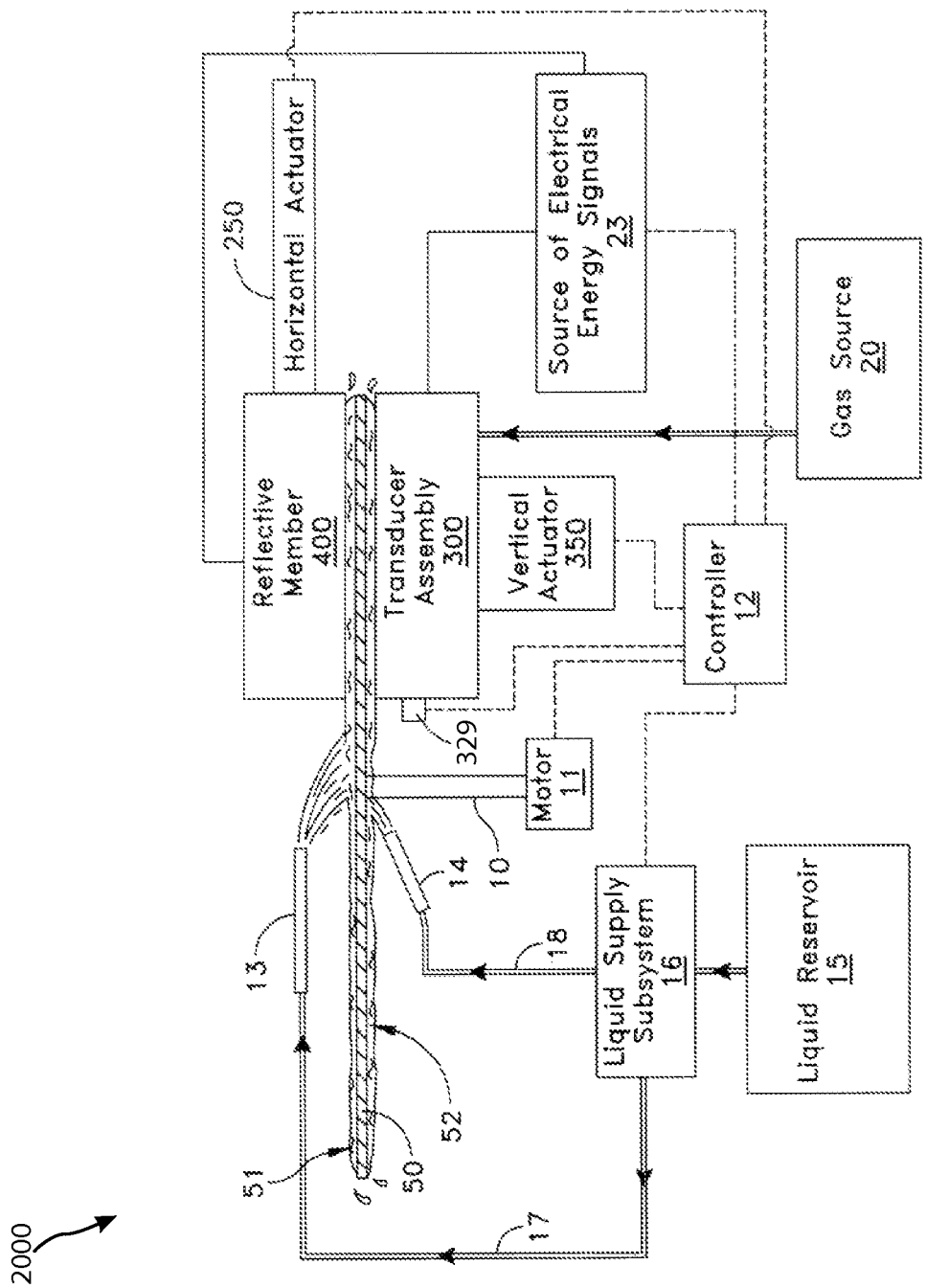
FIG. 13 is schematic of an acoustic energy cleaning system utilizing a reflective member according to an alternative embodiment of the present invention.

FIG. 13 shows an alternative embodiment of the passive cleaning system 2000 wherein the reflective member 400 is positioned adjacent the top surface 51 of the wafer 50 rather than the bottom surface 52. A bottom transducer assembly 300 is used instead of a top transducer assembly 200. This embodiment operates in much the same fashion as the embodiment shown in FIG. 12 except with the reflective member 400 and the transducer assembly 300 being reversed.

Figure 14:
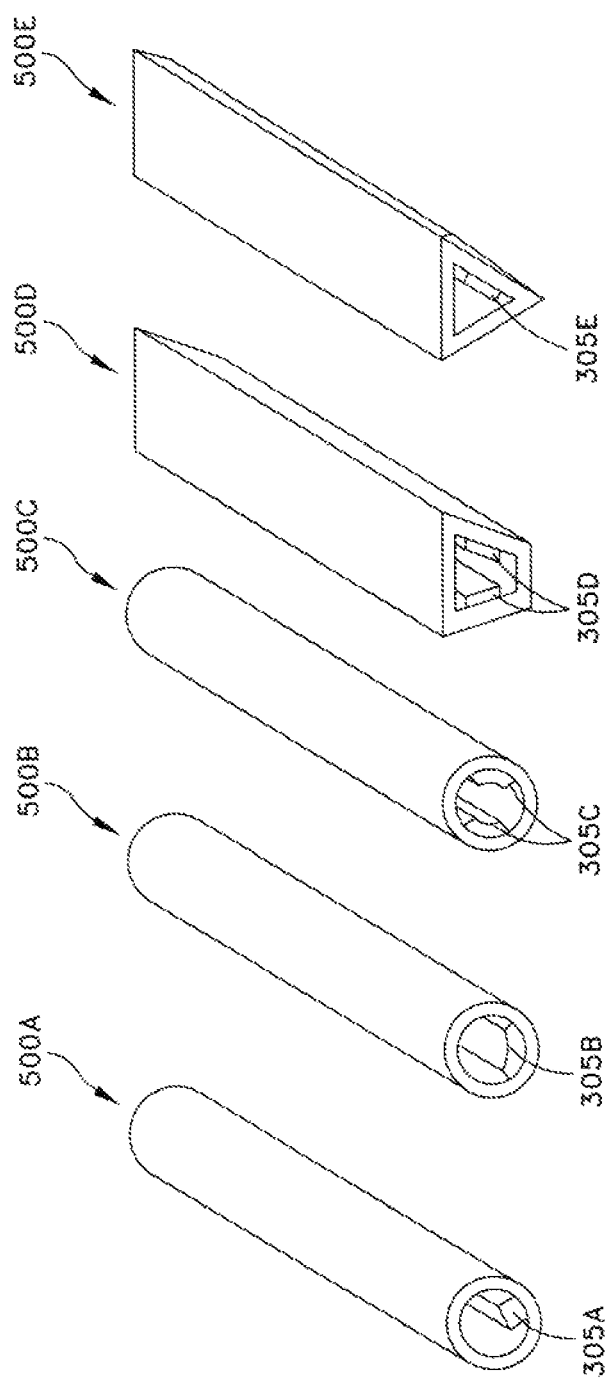
FIG. 14 shows five alternative embodiments of a transducer assembly that can also act as a reflective member for use in the acoustic energy cleaning system of FIG. 12.

Referring now to FIG. 14, it has been discovered that it may be preferable to utilize hollow tubular structures as the reflective member 400. Examples of hollow tubular members 500A-E are exemplified. The hollow tubular member 500A-E can be fitted with transducers 305A-E if desired. The tubular member can be made of quartz, plastic, metals, or other materials. These tubular members 500A-E will have different effects on the transmission of the acoustical energy. The tubular members 500A-E modifiers may be cylindrically shaped, triangular Shaped, and trapezoidal shaped. It should be understood that other shapes may be used and are not limited to those shown, the selection of the shape may vary depending upon the desired results.

The rounded or angled tubular members 500A-E also may be used to direct the reflected acoustical energy at lower angles than that which it is at when it is directed at the wafer 59. Typically these angles are less than 40°. By reflecting the acoustical energy at a shallow angle, a majority of the acoustical energy will be focused on the bottom surface 52 of the wafer 50 from the top transducer assembly 200.

It has also been discovered that the placement of the reflective member 400 from the wafer 50 also plays a role in effectively removing, particles. The distance, or gaps, between the reflective member 400, the transducer assembly 200 or 300 and the wafer 50 is determined so as to accommodate the frequency of the wavelength. The equation for the wavelength is $$\lambda = \frac{v_\omega}{f} \quad (1)$$

where λ=wavelength of an acoustical wave, $v_w$ is the speed of propagation of the wave, and f=frequency of the wave in 1/s Hz. Odd ¼ wavelength (e.g. ¼, ¾, 1¼) gaps tend to act as matching layers that permit energy to pass into the next media, and even ¼ wavelengths (e.g. 0.5, 1.0, 1.5, 2.0) gaps between the wafer 50 and the reflective member 400 tend to enhance the reflective property at the media interface. For example, in FIG. 12, the gap between the top transducer assembly 200 and the wafer 50 may be set for 1 and ¼ wavelengths in order to enhance the transmission of the acoustical energy through the cleaning liquid and the wafer 50. On the opposite side, the gap between the reflective member 400 and the wafer 50 may be set at 1.0 wavelength (i.e. even) in order to enhance the reflection property so as to keep the transmission of acoustical energy directed towards the bottom surface 52 of the wafer 50. In the example provided, when using water and a frequency of 835 kHz, the 1 and 1¼ wavelength, the gap between the transducer assembly 200 and the wafer 50 is approximately 0.087". The gap between the reflective member 400 and the wafer 50, the 1.0 wavelength, is approximately 0.070".

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated, by the broad general meaning of the terms in which the appended claims are expressed.

What is claimed is:

1. A method of processing a flat article comprising:
    a) supporting a flat article in a substantially horizontal orientation within a gaseous atmosphere, the flat article having a bottom surface and a top surface;
    b) rotating the flat article while maintaining the substantially horizontal orientation;
    c) applying a film of liquid to the top surface of the flat article;
    d) applying a film of liquid to the bottom surface of the flat article;
    e) applying acoustic energy to the top surface of the flat article via a first transducer assembly comprising a first transducer and a first transmitter, a portion of the first transmitter in contact with the film of liquid on the top surface of the flat article; and
    f) applying acoustic energy to the bottom surface of the flat article via a second transducer assembly comprising a second transducer and a second transmitter, a portion of the second transmitter in contact with the film of liquid on the bottom surface of the flat article; and
    wherein the portion of the first transmitter that contacts the film of liquid on the top surface of the flat article is not aligned with and does not oppose the portion of the second transmitter that contacts the film of liquid on the bottom surface of the flat article.

2. The method of claim 1 further comprising, prior to step e), horizontally translating the first transducer assembly from a retracted position in which the flat article can be loaded and unloaded without obstruction by the first transducer assembly to a processing position in which the portion of the first transmitter is adjacent to the top surface of the flat article, and, prior to step f), vertically translating the second transducer assembly from a retracted position in which the flat article can be loaded and unloaded without obstruction by the second transducer assembly to a processing position where the portion of the second transmitter is adjacent to the bottom surface of the flat article.

3. The method of claim 1 wherein steps e) and f) are performed in an alternating fashion, concurrently and/or consecutively.

4. The method of claim 1 wherein a dam surrounds at least a portion of a perimeter of the second transmitter so as to form a liquid retaining channel between the second transmitter and the dam, thereby increasing the portion of the second transmitter in contact with the film of liquid on the bottom surface of the flat article.

5. The method of claim 1 wherein the second transmitter has a convex outer surface having an apex that is in contact with the film of the liquid on the bottom surface of the flat article.

6. The method of claim 1 wherein the second transducer assembly further comprises a housing connected to the second transmitter so as to form a substantially enclosed space in which the second transducer is located, the second transducer assembly further comprising one or more openings for flowing a gas into and/or out of the space, the method further comprising: flowing an inert gas into the cavity and in contact with the second transducer.

7. The method of claim 6 wherein the second transmitter and the housing are encapsulated in an inert non-reactive plastic.

8. The method of claim 1 wherein the flat article is a semiconductor wafer, the top surface being a device side of the wafer and the bottom surface being a non-device side of the wafer.

9. The method of claim 1 further comprising measuring a distance between the second transducer assembly and the bottom surface of the flat article with a position sensor.

10. A method of processing a flat article comprising:
    a) supporting a flat article in a substantially horizontal orientation within a gaseous atmosphere, the flat article having a bottom surface and a top surface;
    b) rotating the flat article while maintaining the substantially horizontal orientation;
    c) applying a film of liquid to the top surface of the flat article;
    d) applying a film of liquid to the bottom surface of the flat article;
    e) applying acoustic energy to the top surface of the flat article via a first transducer assembly comprising a first transducer and a first transmitter, a portion of the first transmitter in contact with the film of liquid on the top surface of the flat article; and
    f) applying acoustic energy to the bottom surface of the flat article via a second transducer assembly comprising a second transducer and a second transmitter, a portion of the second transmitter in contact with the film of liquid on the bottom surface of the flat article;
    wherein the portion of the first transmitter that contacts the film of liquid on the top surface of the flat article is aligned with and opposes the portion of the second transmitter that contacts the film of liquid on the bottom surface of the flat article; and
    wherein steps e) and f) are performed in an alternating or consecutive manner.

11. The method of claim 10 further comprising, prior to step e), horizontally translating the first transducer assembly from a retracted position in which the flat article can be loaded and unloaded without obstruction by the first transducer assembly to a processing position in which the portion of the first transmitter is adjacent to the top surface of the flat article, and, prior to step f), vertically translating the second transducer assembly from a retracted position in which the flat article can be loaded and unloaded without obstruction by the second transducer assembly to a processing position in which the portion of the second transmitter is adjacent to the bottom surface of the flat article.

* * * * *